US006882355B2

(12) United States Patent
Kobayashi

(10) Patent No.: US 6,882,355 B2
(45) Date of Patent: Apr. 19, 2005

(54) IMAGE WRITING APPARATUS AND RECORD DISPLAY MEDIUM

(75) Inventor: Hideo Kobayashi, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 95 days.

(21) Appl. No.: 10/374,082

(22) Filed: Feb. 27, 2003

(65) Prior Publication Data

US 2004/0056942 A1 Mar. 25, 2004

(30) Foreign Application Priority Data

Sep. 20, 2002 (JP) ........................................ 2002-276095

(51) Int. Cl.[7] ............................ G03F 9/30; B41J 2/385
(52) U.S. Cl. ........................................ 347/111; 345/87
(58) Field of Search ............................ 347/111; 345/55, 345/84, 87

(56) References Cited

U.S. PATENT DOCUMENTS 6,008,877 A * 12/1999 Akiyama et al. ........... 349/147
6,774,880 B1 * 8/2004 Kobayashi .................... 345/84
2004/0105614 A1 * 6/2004 Kobayashi et al. ........... 385/16

FOREIGN PATENT DOCUMENTS

| | | | |
|---|---|---|---|
| JP | 4-9964 | 1/1992 | |
| JP | 04-009964 | * 1/1992 | .......... G03G/15/00 |
| JP | 4-73615 | 3/1992 | |
| JP | 10-52973 | 2/1998 | |
| JP | 2000-347225 | 12/2000 | |

OTHER PUBLICATIONS

S. Yamamoto, et al., "A Novel Photoaddressable Electronic Paper Utilizing Cholesteric LC Microcapsules and Organic Photoducer". SID 01 Digest, pp. 362–365.

Japan Hardcopy '96 Fall Meeting, The Conference of Japan Hardcopy for the Society of Electrophotophy of Japan.

* cited by examiner

*Primary Examiner*—Huan Tran
(74) *Attorney, Agent, or Firm*—Morgan, Lewis & Bockius LLP

(57) ABSTRACT

The present invention provides an image writing apparatus capable of sequentially writing images into plural record display media at a high speed with high reliability in displaying the written images, and the record display media used for the image writing apparatus. Each of the record display media can be used repeatedly by rewriting. The image writing apparatus has: a conveyor section which conveys a record display medium including a display layer on which an image is displayed in a non-volatile manner, in which the display layer sandwiched between opposed electrodes; a contact section which electrically contacts the electrodes of the record display medium; and a writing section which writes an image into the display layer of the record display medium, the electrodes of which are contacted by the contact section.

21 Claims, 13 Drawing Sheets

IMAGE WRITING APPARATUS AND RECORD DISPLAY MEDIUM

BACKGROUND OF THE INVENTION

1. Field of the Invention

The present invention relates to an image writing apparatus which writes an image into a record display medium in which a display layer for displaying an image is stacked between a pair of substrates on both of which electrodes are formed, and to the record display medium thus used.

2. Description of the Related Art

In recent years, record display media have come to attract great attentions as media to transfer information other than paper media and electronic display devices. The record display media each use a display element having a capability of memorization. In each record display medium, a display layer and the like for displaying information are stacked between a pair of substrates on both of which electrodes are formed. The record display medium has the functions: an information display function capable of displaying digital information and image information; a memory function capable of maintaining displayed information even in a powerless state; and a rewriting function capable of erasing written information to reuse the medium. This record display medium is also physically characterized in its flexibility and light weight, and has a feature that the medium can be separated from a writing apparatus for writing information after information is written by the writing apparatus. The medium can then be carried about like a paper medium, and the written information can be read with the medium held in hands.

This kind of display medium is called "electronic paper", for example. Applications of these media to electronic news papers, electronic books, distributions of resident cards in the field of administrative services, etc. have been studied.

Discussions are now made on use of memorable liquid crystal for a display element with capability of memorization which forms part of the "electronic paper", for example, an electrophoretic element, electrophoresis element, microcapsule, or cholesteric liquid crystal.

FIGS. 1A to 1D show types of record display media classified depending on electrodes.

FIG. 1A shows a matrix type. Plural striped electrodes 3 are formed on each of inner surfaces of substrates 2 opposed to each other with a display layer 1 interposed between the substrates. Those plural electrodes 3 that are opposed to each other with the display layer 1 interposed are arranged to be perpendicular to each other.

FIG. 1B shows a single electrode type. One electrode 4 is formed on the inner surface of one of substrates 2 opposed to each other with a display layer 1 interposed between the substrates 2.

FIG. 1C shows an electrodeless type. A display layer 1 is sandwiched between substrates 2. No electrode is provided.

FIG. 1D shows an optical writing type. A full-plane electrode 4 is formed on each of inner surfaces of substrates which are opposed to each other with a display layer 1 and optical switching layer 5 interposed between the substrates.

An example of use of a record display medium according to the matrix type will be a device as follows. Electrodes arrayed on a two-dimensional matrix composed of X lines and Y rows are applied with a predetermined voltage at a timing. The state of each of pixels respectively positioning at intersections of the two-dimensional matrix is thus controlled to turn ON or OFF to write information (see Patent Document 1.)

Record display media of this type are generally used for liquid crystal display devices. A record display medium of this type requires electrodes arrayed on a two-dimensional matrix corresponding to the number of pixels. Accordingly, at least 1,120 electrodes are necessary even in case of monochrome display by a VGA (Video Graphics Array) panel having 640×480 pixels, for example.

To reduce the number of arrayed electrodes, a technique has been considered, that is, the technique in which the record display medium is provided with receiving means for receiving information as data to be displayed on the record display medium, and display means for converting the received data into driving data to be displayed on the record display medium.

An example which uses a record display medium of the single electrode type will be a device of head-writing type. In this device, a record display medium is conveyed in a direction perpendicular to a one-dimensional head that applies electric or thermal energy to the record display medium to write information (see Patent Document 2.)

In the device of head-writing type, an electric head opposed to one single electrode formed on a record display medium with a display layer interposed therebetween constitutes another electrode opposed to the one single electrode formed on the record display medium. Information is recorded on the display layer by an electric field or current generated between the electric head and the one single electrode of the record display medium, or by Joule heat generated by the current.

In a record display medium using electrophoresis or in a record display medium using a display element micro-encapsulated liquid crystal or coated liquid crystal contained in a binder, information is recorded by applying a voltage between the electric head and the one single electrode of the record display medium. As an example using a record display medium of the electrodeless type will be a device of head-writing type using a thermal head (see Patent Document 3.)

The thermal head controls the amount of heat to be applied to the record display medium by controlling a current to be flowed through a heat generation member provided in the head. A display layer in a record display medium of the electrodeless type is formed of coloring material such as a leuco dye for example, which is heat-reversible. Controlled heat which expresses information is applied to the display layer from the thermal head. The information is then displayed in colors.

An example using a record display medium of the optical writing type will be an elgraphy technique (see Non-Patent Document 1 and Non-Patent Document 2) or a rewritable printer (see Patent Document 4.)

The record display medium of the optical writing type has a structure in which a display element and an optical switching element are sandwiched between a pair of electrodes. An optical image writing apparatus has a voltage application section and an exposure section. A driving voltage is applied to the pair of electrodes from the voltage application section, and light which transfers information is irradiated on the optical switching element from the exposure section. An optical image is thus written into the display element. In that area of the record display medium that is irradiated with light, resistance of the optical switching element decreases and a high voltage is applied to the display element in this area, and accordingly information is written. In the other remaining area that is not irradiated with light, resistance of the optical switching element does not change but is maintained and no high voltage is applied, and accordingly information is not written.

In addition to the record display media described above, there is another record display medium of the matrix type. This medium has a power source circuit including a power supply coil, a drive circuit, and a data transmitter/receiver circuit. In this type, electric power is supplied by electromagnetic induction, and data expressing information to be displayed on a display element is transmitted/received wirelessly.

Patent Document 1: Japanese Patent Application Laid-Open Publication No. 2000-347225 (paragraphs 0020 to 0022 and FIGS. 2 to 5)

Patent Document 2: Japanese Patent Application Laid-Open Publication No. 04-073615 (embodiments and FIGS. 1, 3, and 5)

Patent Document 3: Japanese Patent Application Laid-Open Publication No. 10-52973 (paragraph 0046 and FIG. 3)

Patent Document 4: Japanese Patent Application Laid-Open Publication No. 4-9964 (embodiments and FIGS. 1 to 3)

Non-Patent Document 1: SID 01 DIGEST (pp 362 to 365)

Non-Patent Document 2: JAPAN Hardcopy '96 Fall Meeting (pp 25 to 28)

Record display media as described above, however, result in the following problems in writing into display elements.

That is, users may intend to write information into a large number of record display media, to separate the media from a writing apparatus, and to carry the media with themselves. However, no writing means has been realized with high reliability and with ability to write information rapidly into a large number of record display media and to write different information items into one same record display medium respectively for many times.

As disclosed in Patent Document 1, plural record display media of the matrix type may be connected to a connector, and sequential or simultaneous writing may be carried out from a writing apparatus. According to this technique, writing into all the connected record display media can be completed in a very short time if the media can be connected to the connector in a very short time. However, a mechanism which attaches the connector to the writing apparatus is complicated. Also, as one same record display medium is used repeatedly and the medium is connected to the connector very often, it is therefore difficult to maintain reliability about the contact points of the connector.

In a writing apparatus of the head writing type using electrodeless record display media, information is written while conveying each record display medium. Therefore, information can be written in a short time by improving the conveyor means for conveying the record display media so as to achieve a higher speed. Meanwhile, a thermal head which thermally writes information has a simpler structure than the means which writes information into record display media of the matrix type, and also, manufacturing costs for the thermal head can therefore be lowered. However, the thermal head directly contacts each record display medium. Therefore, dust and the like which have stuck to a record display medium are transferred to the thermal head while the record display medium is used repeatedly. The dust may be miswritten as a stripe on the record display medium and cause a problem of defectiveness in writing. It is difficult in principle to interpose a protect film or sheet having thickness enough to protect the display element, between the thermal head and the surface of the record display medium that contacts the head. The display element of the record display medium may consequently be damaged due to the dust or foreign material which sticks to the thermal head.

In general, a writing apparatus of the head writing type which uses record display media of the single electrode type applies a voltage between the head and the electrode of the record display medium, to record information on the display element. This apparatus causes the same problem as the aforementioned writing apparatus of the head writing type.

In contrast, record display media of the optical writing type can more steadily ensure resolution regardless of the number of electrodes, compared with the media of the matrix type. Besides, the paired electrodes of the medium of the optical writing type can easily guarantee the reliability in writing information. Further, the writing means does not contact the record display media, so that dirt of any record display medium is not transferred to the writing apparatus and does not further affect another record display medium. Reliability can thus be attained easily in writing information in this type of medium. Furthermore, a driving function based on data need not be provided in each record display medium because the data are not transferred from the writing means to the record display.

Particularly, a record display medium of the optical writing type, which uses an optical switching element and has been invented by the present inventors, can be manufactured by printing processes, and mass production of which is therefore so easy that advantages are attained in costs.

However, when writing an image into plural record display media of the optical writing type, a problem arises in the technique described in Non-Patent Document 1. This technique describes that an image is written with the record display media set on a display or exposure panel and the media are detached from the writing apparatus after the writing. In this technique however, operation must be repeated for every one of the record display media, resulting in difficulties in achieving a higher speed.

Further, there is also a problem in another technique disclosed in Patent Document 4 describing an information recording section in which an information recording medium and an optical switching layer are stacked. High-speed printing is carried out by a printer which has the information recording section further provided with a means for supplying the optical switching layer with print information and a means for conveying/discharging the medium. This technique adopts a structure in which the information record medium and the optical switching layer are separate, and thus the tolerable number of rewritings depends on lifetime of a photoconductive layer. If dust or dirt sticks to an information recording medium which has been used plural times, unnecessary space is created between the medium and the optical switching layer and causes electric loss. Besides, a proper voltage cannot be applied to the information recording medium due to electrical characteristics of the dust or dirt. As a result, quality of a displayed image deteriorates.

To avoid this problem, a proper space may be prepared but need a means for maintaining the proper space and a driving means of a high voltage. A resulting apparatus may then be not only expensive but also unuseful in practice from the viewpoint of energy saving.

SUMMARY OF THE INVENTION

The present invention has been made in view of the above circumstances and provides an image writing apparatus capable of sequentially writing images into plural record display media which can be used repeatedly by rewriting, at a high speed with high reliability in display of the written image, and also provides the record display media of optical writing type for use with the image writing apparatus.

An image writing apparatus according to an aspect of the present invention has: a conveyor section which conveys a record display medium including a display layer on which an image is displayed in a non-volatile manner, in which the display layer are sandwiched between opposed electrodes; a contact section which electrically contacts the electrodes of the record display medium; and a writing section which writes an image into the display layer of the record display medium, the electrodes of which are contacted by the contact section.

In this structure, if the record display medium is of a type including matrix electrodes, there are provided a contact section which contacts scanning electrodes among the matrix electrodes, and another contact section which contacts data electrodes among the matrix electrodes. An image based on an electric signal, which expresses an image and is supplied from the writing section, is written into pixels on the matrix electrodes that are contacted by the contact sections, while the record display medium is being conveyed. Alternatively, if the record display medium is of an optical writing type including a pair of electrodes, the record display medium which has been conveyed to a predetermined writing position is stopped and kept stationary relatively to the contact section and the writing section. A writing voltage is then applied between the pair of electrodes from the contact section, and light expressing an image is irradiated from the writing section, to write instantly the image. After the image is thus written, the record display medium can be conveyed again. The record display medium of this optical writing type can be stopped and kept relatively stationary not only in a horizontal direction but also in a vertical direction. An image can then be written.

A record display medium according to an aspect of the present invention has: electrodes respectively formed on a pair of opposed substrates; a display layer which displays an image; and an optical switching layer having resistance which changes depending on irradiation of light, wherein the display layer and the optical switching layer are stacked between the electrodes, and contact terminals electrically conducted to the electrodes are provided on an outer surface of one of the pair of substrates.

Further, a record display medium according to another aspect of the present invention has: electrodes respectively formed on a pair of opposed substrates; a display layer which displays an image; and an optical switching layer having resistance which changes depending on irradiation of light, wherein the display layer and the optical switching layer are stacked between the electrodes, and contact terminals electrically conducted to the electrodes formed in the inner surfaces of the opposed substrates are provided respectively on outer surfaces of the pair of substrates.

In each of the record display media described above, the contact terminals may be positioned in the rear side along the conveyance direction where the record display medium is set in an image writing apparatus to write an image into the medium and is conveyed in a horizontal direction. This positioning is advantageous for position control of the record display medium. More advantageous for the position control of the record display medium is to provide the contact terminals at laterally symmetrical positions in the rear side along the conveyance direction.

According to the image writing apparatus of the present invention, information with high reliability can be written sequentially at a high speed into plural record display media of matrix electrode type and into plural electronic papers of optical writing type, each of which can be repeatedly used by rewriting. According to the electronic paper of the present invention, a writing voltage can be applied easily to electrodes of the electronic paper being conveyed because contact terminals are provided on one outer surface of the electronic paper.

BRIEF DESCRIPTION OF THE DRAWINGS

Preferred embodiments of the present invention will be described in detail based on the following figures, wherein.

DESCRIPTION OF THE PREFERRED EMBODIMENTS

Embodiments of the present invention will now be described.

First Embodiment

In the first embodiment, an image is written while conveying a record display medium having matrix electrodes.

Figure 1A:
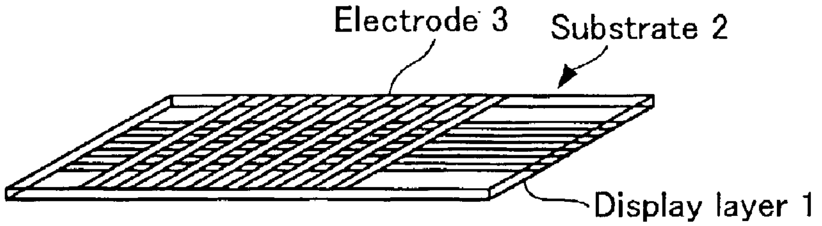
FIGS. 1A to 1D are views showing types of record display media classified depending on electrodes.
Figure 1B:
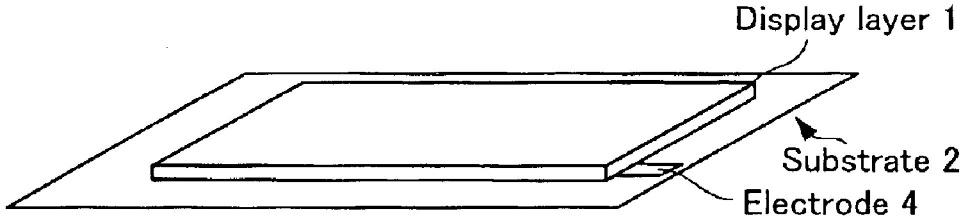
Figure 1C:
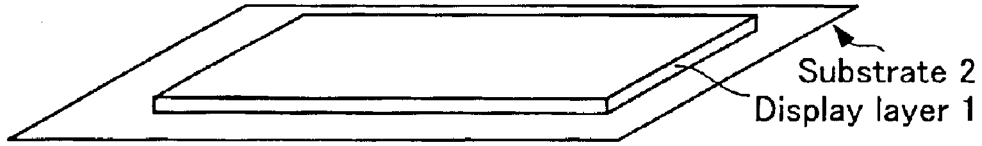
Figure 1D:
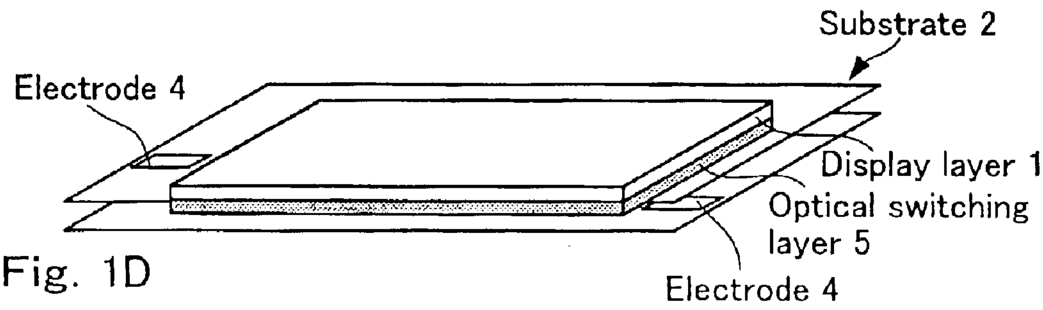
Figure 2:
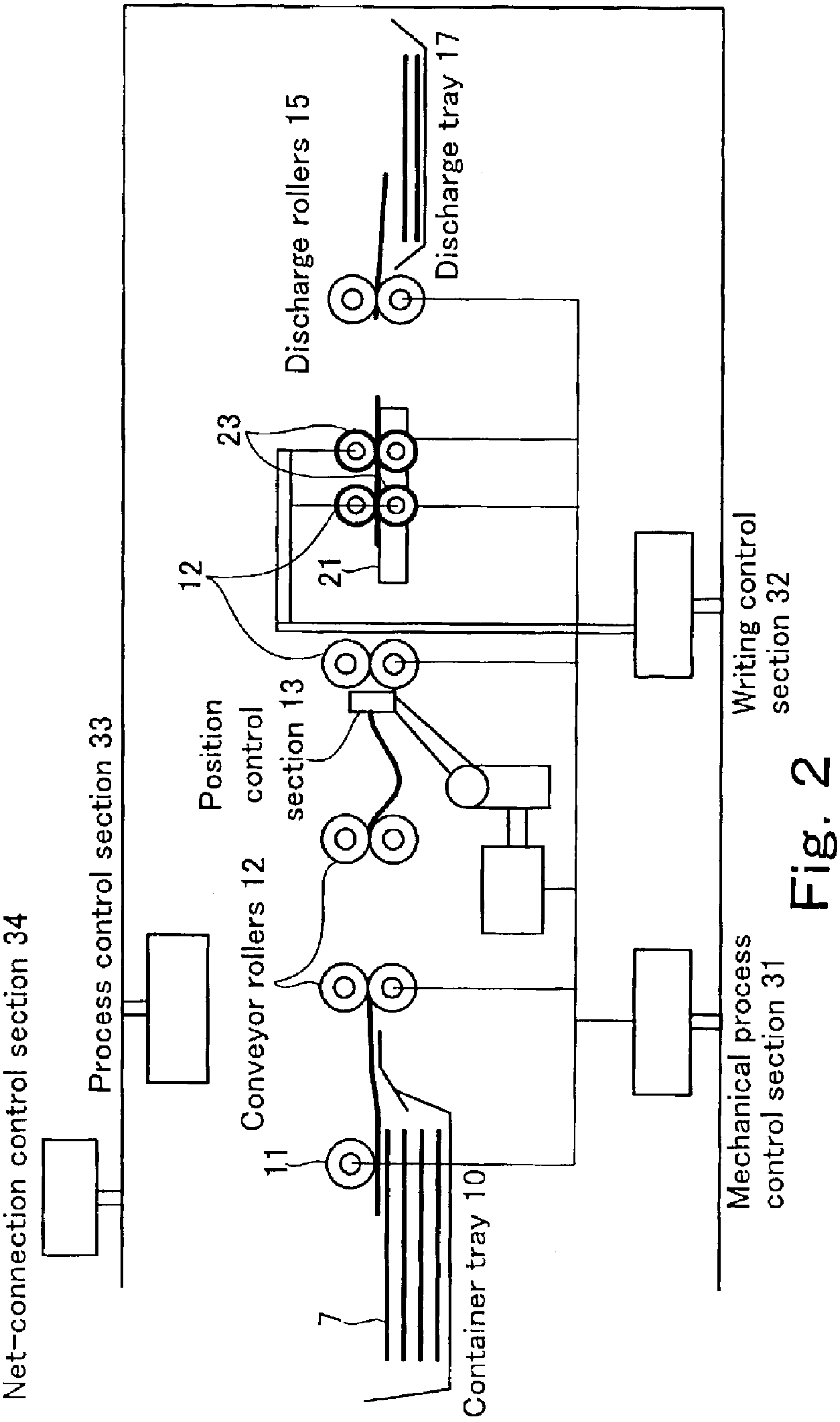
FIG. 2 is a schematic structural view showing an image writing apparatus according to the first embodiment of the present invention.

FIG. 2 is a schematic structural view showing an image writing apparatus according to the first embodiment.

The image writing apparatus shown in FIG. 2 has a container tray 10, a feed roller 11, conveyor rollers 12, a position control section 13, a stage 21, plural contact rollers 23, discharge rollers 15, and a discharge tray 17. The container tray 10 contains record display media 7 into which images are written. The feed roller 11 pulls out one after another of the record display media contained in the tray. The conveyor rollers 12 convey each record display medium pulled out by the feed roller 11. The position control section 13 aligns the top end of each record display medium 7 conveyed by the conveyor rollers 12, with the axial direction intersecting the process direction. On the stage 21, an image is written into each record display medium 7. The plural contact rollers 23 contact the matrix electrodes of each record display medium 7 passing through the stage 21. The discharge rollers 15 discharge each record display medium 7 into which an image has been written. The discharge tray 17 stores the record display media on which images have been written.

The image writing apparatus according to the present embodiment also has a mechanical process control section 31, a writing control section 32, a process control section 33, and a net-connection control section 34. The mechanical process control section 31 drives and controls the feed roller 11, conveyor rollers 12, position control section 13, and discharge rollers 15. The writing control section 32 sends signals expressing images to the plural contact rollers 23 respectively, and controls image writing performed on the record display medium. The process control section 33 adjusts control timings of the mechanical process control section 31 and the writing control section 32, to control a series of processes from pulling-out of every record display medium contained in the container tray up to discharging of the medium after writing of an image. The net-connection control section 34 controls network connection when image information to be written into a record display medium is inputted through a network.

Suppose that image information to be written into a record display medium is inputted through the net-connection control section 34, for example. The process control section 33 then lets the mechanical process control section 31 start a control operation, and also sends the inputted image information to the writing control section 32. The mechanical process control section 31 lets the feed roller 11, conveyor rollers 12, and discharge rollers 15 rotate so that one record display medium 7 is pulled out from the container tray 10. The pulled-out record display medium 7 is conveyed by the conveyor rollers 12. At this time, the mechanical process control section 31 closes a gate of the position control section 13, so that the top end of the record display medium 7 is aligned with an axial direction intersecting the process direction. After the position of the record display medium 7 is thus adjusted, the process control section 33 lets the writing control section 32 start writing control. The position control section 13 immediately opens the gate, so that the record display medium 7 is conveyed to the stage 21. The record display medium 7 thus conveyed to the stage 21 moves forward in the process direction, with the matrix electrodes of the medium kept in contact with the plural contact rollers 23. The contact rollers 23 are respectively supplied with signals expressing an image from the writing control section 32. An image is formed sequentially on pixels formed on the matrix electrodes of the record display medium 7. The top end of the record display medium 7 on which the image has been written reaches the discharge rollers 15 and is then sent to the discharge tray 17 by the discharge rollers 15.

Subsequently, the same operation as described above is repeated a number of times corresponding to a required number of media. Plural record display media 7 are then stacked on the discharge tray 17.

In the present embodiment, the feed roller 11 is used as a sheet-feed mechanism which pulls out one after another of the record display media 7 contained in the container tray 10. The sheet-feed mechanism is not limited to the feed roller 11 but may be any of different mechanisms as follows.

FIGS. 3A to 3D show examples of other sheet-feed mechanisms.

Figure 3A:
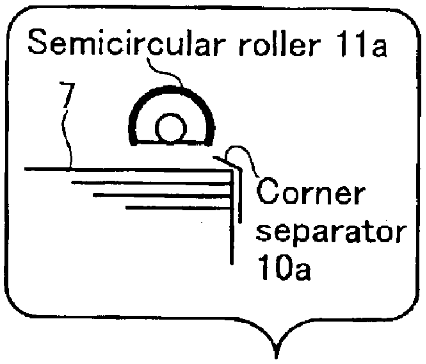
FIGS. 3A to 3D are views showing other examples of the sheet-feed mechanism shown in FIG. 2.

FIG. 3A shows a sheet-feed mechanism in which the roller has a semicircular shape. As the semicircular roller 11*a* rotates, an edge of the semicircular roller 11*a* touches a record display medium 7, generating a friction force to feed the medium. When the friction force acting on the uppermost medium becomes greater than resistance of a corner separator 10*a* provided in the container tray 10, the record display medium 7 is pulled and fed out.

Figure 3B:
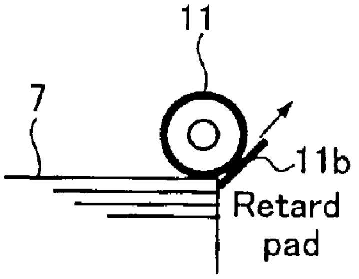

FIG. 3B shows a sheet-feed mechanism in which a circular feed roller 11 for feeding record display media is combined with a retard pad 11*b* as a member for preventing forward movement of each medium. From two sheets of record display media 7 which have entered into between the feed roller 11 and the retard pad 11*b*, only one sheet of medium is fed out based on a difference in friction coefficients.

Figure 3C:
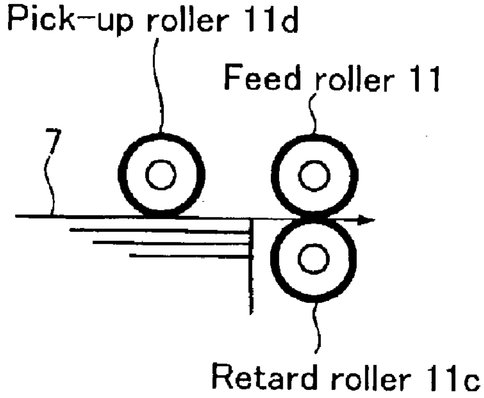

FIG. 3C shows a sheet-feed mechanism in which a pick-up roller 11*d* for pulling out a record display medium 7 is added to a feed roller 11 and a retard roller 11*c*. The retard roller 11*c* is rotated more slowly than the feed roller 11. From two sheets of record display media 7 pulled out by the pick-up roller 11*d*, only one sheet of medium is fed out based on a difference in friction coefficients.

Figure 3D:
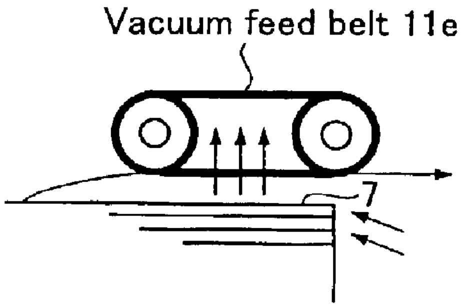

FIG. 3D shows another type of sheet-feed mechanism. Air is blown from a nozzle not shown to top end parts of record display media 7, to float up the top end part of one sheet of medium. Meanwhile, the medium is suctioned by a vacuum plenum provided for a vacuum feed belt 11*a* which feeds out the medium.

Also in the present embodiment, the conveyor rollers 12 on each of which rubber or the like is placed around are used as a conveyor section for conveying record display media 7. However, the conveyor section may be a belt which fixes electrostatically the record display medium 7 or has a suction mechanism such as a vacuum. Alternatively, the conveyor section may be a gripper mechanism which conveys the record display medium 7, gripping the top end of the medium. When record display media 7 are conveyed by the conveyor rollers 12, the record display media 7 may have different thicknesses and friction coefficients in some cases. In these cases, a mechanism for absorbing influences from the different thicknesses and friction coefficients may be provided so that skewing might not be caused by the influences.

The position control section in the present embodiment can adopt any of types which will be described below. The present embodiment is not limited to those types but any mechanism is applicable as far as the mechanism absorbs influences from differences in thicknesses and friction coefficients and prevents skewing.

Figure 4A:
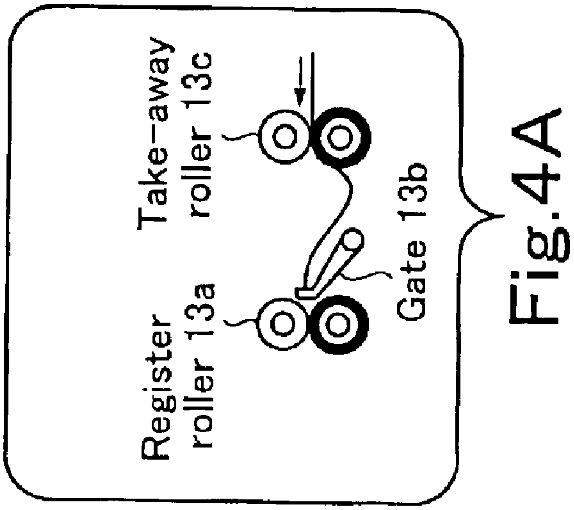
FIGS. 4A to 4C show types of mechanism of adjusting the position of a record display medium being conveyed.
Figure 4B:
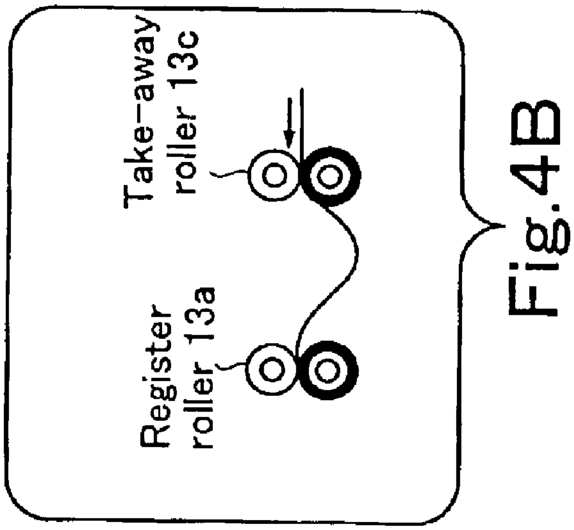
Figure 4C:
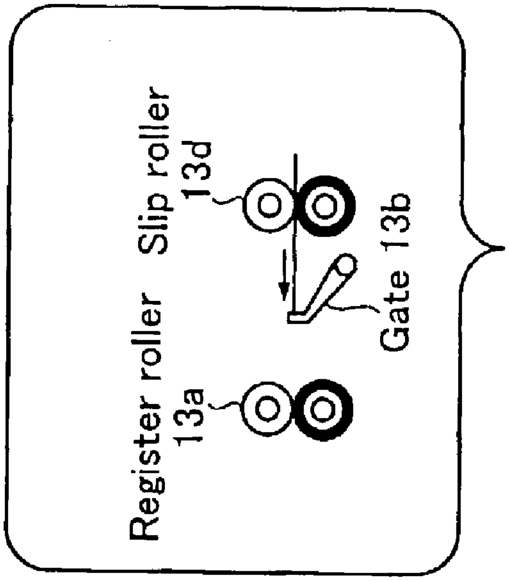

FIGS. 4A to 4C show types of mechanism of adjusting the position of a record display medium being conveyed.

FIG. 4A shows a gate loop type in which a gate 13*b* is provided. The gate 13*b* aligns the top end position of a record display medium immediately before a register roller 13*a* on the conveyance route along which the record display medium is conveyed from a take-away roller 13*c* to the register roller 13*a*. The position of the record display medium is adjusted by opening/closing the gate 13*b*.

FIG. 4B shows a roll loop type. In this type, rotation of a register roller 13*a* is stopped instantaneously or slowed down when conveying a record display medium from a take-away roller 13*c* to the register roller 13*a*. The top end position of the record display medium which has entered below the register roller 13*a* is thus aligned to adjust the opsition of the record display medium.

FIG. 4C shows a gate slip type. A gate 13*b* which aligns the top end position of a record display medium is provided in the middle of the conveyance route along which the record display medium is conveyed from a slip roller 13*d* to a register roller 13*a*. The position of the record display medium is adjusted by opening/closing the gate 13*b*.

Figure 5:
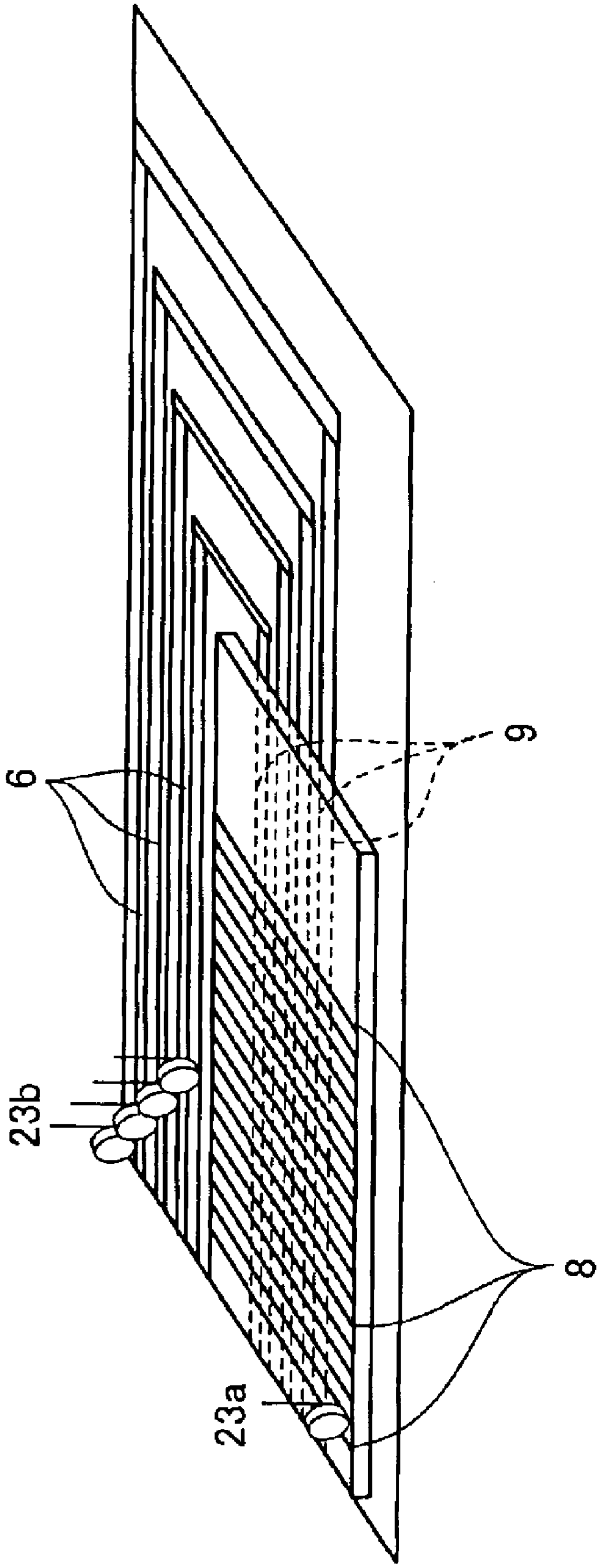
FIG. 5 is a view showing a state in which plural contact rollers contact matrix electrodes of a record display medium used in the first embodiment.

FIG. 5 shows a state in which plural rollers contact the matrix electrodes of the record display medium used in the present embodiment.

In the record display medium shown in FIG. 5, cholesteric liquid crystal is provided between a pair of substrates which are respectively provided with plural scanning electrodes 8 and plural data electrodes 9. The data electrodes 9 are perpendicular to the scanning electrodes 8, and these electrodes are transparent. Each of intersections between the scanning electrodes 8 and the data electrodes 9 constitutes one pixel into which information is written, in the record display medium.

A notched part is provided at a side end of the surface of a substrate of each record display medium contained in the container tray and faced upward. The plural scanning electrodes 8 are exposed from the notched part. As the record display medium moves forward in the process direction, a scan-data writing contact roller 23*a* electrically contacts the scanning electrodes 8 sequentially.

On the same surface of the substrate of each record display medium, plural contact terminals 6 respectively conducting the data electrodes 9 formed on the other substrate in the lower side of the record display medium are provided in parallel along the process direction, at the other side end opposite to the aforementioned side end where the scanning electrodes 8 are exposed. As the record display medium moves forward in the process direction, plural data writing contact rollers 23*b* provided in correspondence with the contact terminals 6 electrically contact the data electrodes, respectively.

It is not always necessary to use only one scan-data writing contact roller 23*a* which contacts the notched part where the plural scan electrodes 8 are exposed. Plural scan-data writing contact rollers 23*a* may be provided with an interval inserted between each other. In addition, the contact terminals 6 on the outer surface of a substrate may be provided in one side or both sides of the substrate.

Components constituting each record display medium may be made of materials as follows.

The substrates may be made of a light-transmissible dielectric such as glass, polycarbonate, polyethylene terephthalate, polyethersulfone, or the like.

The scanning electrodes 8 and data electrodes 9 may be made of a light-transmissible conductive material, e.g., conductive oxide such as ITO, $SnO_2$, ZnO, Al, or the like, or conductive resin such as polypyrrole, polyaniline, or the like.

Cholesteric liquid crystal may be made of a known nematic liquid crystal composition added with a chiral agent. The known nematic liquid crystal composition may be selected from groups of cianobiphenyl, phenylcyclohexyl, phenyl benzoate, cyclohexyl benzoate, azomethine, azobenzene, pyrimidine, dioxane, cyclohexylcyclohexane, stilbene, tolan, and the like. The chiral agent may be made of a chemical compound or the like which has an optically active group such as a cholesterol derivative, 2-methylbuthyl, or the like.

Each of the contact rollers 23 is inputted with, for example, a pulse signal from the writing control section 32. Information of 1 bit is written into each pixel which is inputted with a plus pulse signal from the scan-data writing contact roller 23*a* and a minus pulse signal from a data writing contact roller 23*b*.

For example, if the writing period is set to 100 ms per one scanning electrode 8, pixels formed in each record display medium are 80 dots in the process direction and 60 dots in the direction intersecting the process direction.

Thus, the matrix electrodes of each record display medium are arranged such that the electrodes contact the contact rollers 23 as the medium moves forward in the process direction. As a result, information can be written at a high speed into each record display medium. Compared with matrix electrodes of a type connected to a connector, reliability concerning electric contacts is improved more.

A second embodiment of the present invention will now be described.

Second Embodiment

In the second embodiment, light is irradiated onto each of record display media of optical writing type, to write an image. The second embodiment corresponds to the second exemplary form of an image writing apparatus according to the present invention. Each electronic paper used in the second embodiment is the second form of the record display medium according to the present invention (the first form of the record display medium according to the present invention will be described later).

Figure 6:
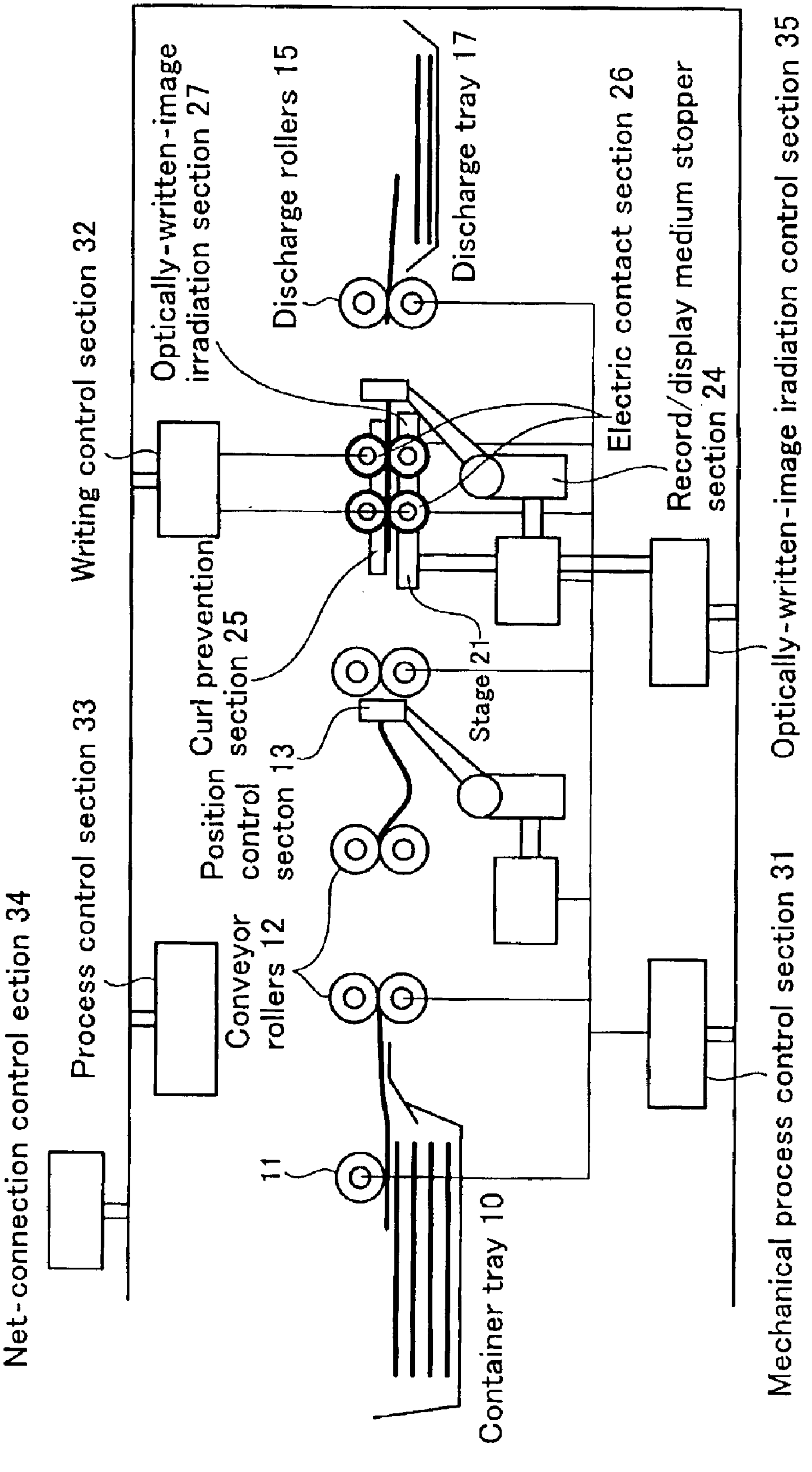
FIG. 6 is a schematic structural view showing an image writing apparatus according to the second embodiment of the present invention.

FIG. 6 is a schematic structural view showing an image writing apparatus according to the second embodiment.

The image writing apparatus according to the present embodiment needs to irradiate light on an entire surface of the electronic paper to write an image, unlike the image writing apparatus according to the first embodiment. The apparatus according to the present embodiment therefore has a record display medium stopper section, a curl prevention section, electric contact sections, and an optically-written-image irradiation section. The record display medium stopper section stops the electronic paper to be kept stationary. The curl prevention section prevents curling of the electronic paper which is stopped and kept stationary. The electric contact sections apply a voltage to a pair of electrodes formed on the entire surface of the electronic paper. The optically-written-image irradiation section irradiates light expressing an image onto the entire of one surface of the stationary electronic paper. Note that a container tray, conveyor rollers, a position control section, stage, discharge rollers, and a discharge tray are identical to those of the image writing apparatus according to the first embodiment. These components are therefore denoted by identical reference symbols. Descriptions will now be made only of components different from those of the first embodiment.

The image writing apparatus shown in FIG. 6 has a container tray 10, a feed roller 11, conveyor rollers 12, position control section 13, a stage 21, a record display medium stopper section 24, a curl prevention section 25, electric contact sections 26, an optically-written-image irradiation section 27, discharge rollers 15, and a discharge tray 17. The record display medium stopper section 24 stops an electronic paper to be kept stationary at a predetermined position when the electronic paper reaches the stage. The curl prevention section 25 prevents curling of the electronic paper kept stationary at the predetermined position. The electric contact sections 26 contact a pair of electrodes through "windows" provided in upper and lower substrates of the electronic paper, to apply a voltage between the paired electrodes. The optically-written-image irradiation section 27 irradiates light expressing an image onto the entire of one surface of the electronic paper. The discharge rollers 15 discharge the electronic paper on which the image has been written.

The curl prevention section 25 which prevents curling of each electronic paper may effectively adopt a mechanism of pressing down an electronic paper by a transparent glass board or transparent plastic board, for example. An element such as a solenoid coil or piezoelectric element may be used for a drive mechanism for pressing and releasing the board.

The curl prevention section is thus provided because of the following grounds. That is, for every electronic paper, an image is written instantaneously into the entire of the display layer by applying a voltage and by irradiating light. If the electronic paper is warped or deformed, unevenness appears in the amount of light irradiated on the light switching layer. The unevenness may cause blurring in the written image.

The image writing apparatus according to the present embodiment has a mechanical process control section 31, a writing control section 32, an optically-written-image irradiation control section 35, a process control section 33, and a net-connection control section 34. The mechanical process control section 31 drives and controls a feed roller 11, conveyor rollers 12, a position control section 13, a record display medium stopper section 24, a curl prevention section 25, and discharge rollers 15. The writing control section 32 controls the timing and electric potential at which a voltage is applied between a pair of electrodes of the electronic paper from the electric contact sections 26. The optically-written-image irradiation control section 35 makes the optically-written-image irradiation section 27 display a predetermined optical image or controls brightness of a screen. The process control section 33 adjusts control timings of the mechanical process control section 31, the writing control section 32, and the optically-written-image irradiation control section 35, to control a series of processes from pulling-out of every electronic paper contained in the container tray 10 up to discharge of the paper after writing of an image. The net-connection control section 34 controls network connection when image information to be written into an electronic paper is inputted through a network.

In the present embodiment, the mechanical process control section 31 controls the conveyor rollers such that the electronic paper is conveyed onto the stage 21. The section 31 also controls the record display medium stopper section 24 such that the conveyed electronic paper is kept stationary on the stage 21. Further, the optically-written-image irradiation control section 35 controls the optically-written-image irradiation section 27 such that light expressing an image is irradiated on the electronic paper kept stationary. The writing control section 32 controls the electric contact sections 26 to apply a writing voltage between the pair of electrodes. An image is thus written into the electronic paper.

However, the optically-written-image irradiation section 27 and the electric contact sections 26 may move in the same direction at the same speed as the electronic paper. The electronic paper can then be kept stationary relatively. Even in this way, an image can also be written into the electronic paper.

When an electronic paper is stopped, the electronic paper should preferably be subjected to position control.

Described next will be the electronic paper of optical writing type (which will be simply referred to as "electronic paper" hereinafter) used in the present embodiment.

Figure 7A:
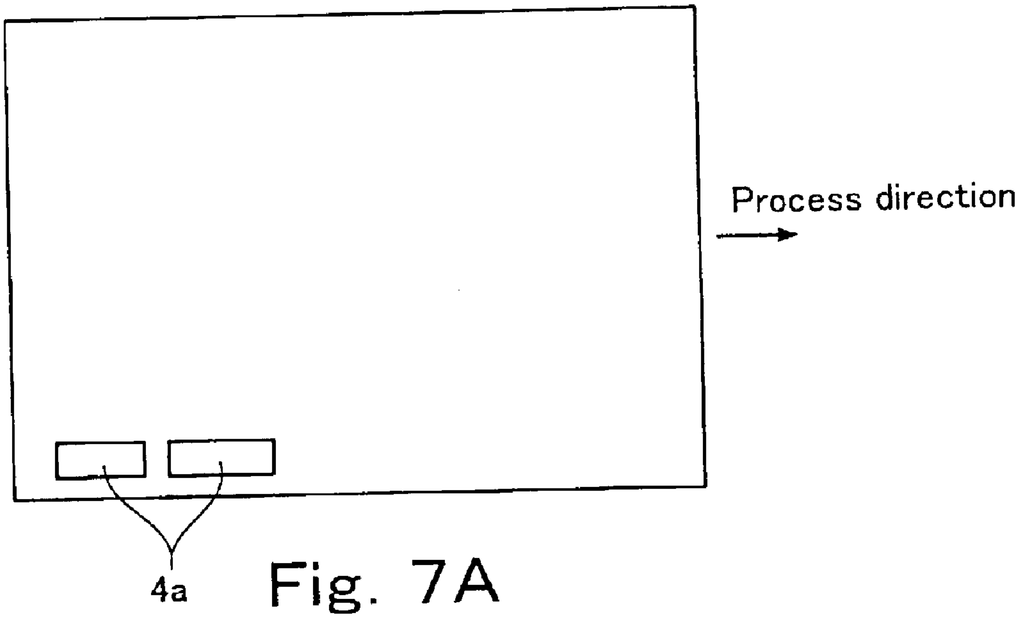
FIGS. 7A and 7B are schematic views showing an electronic paper used in the second embodiment.
Figure 7B:
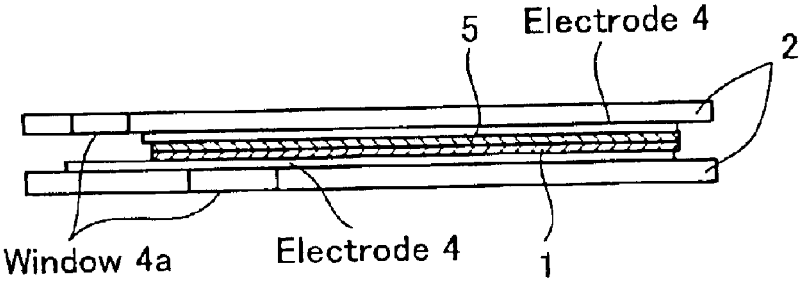
Figure 8A:
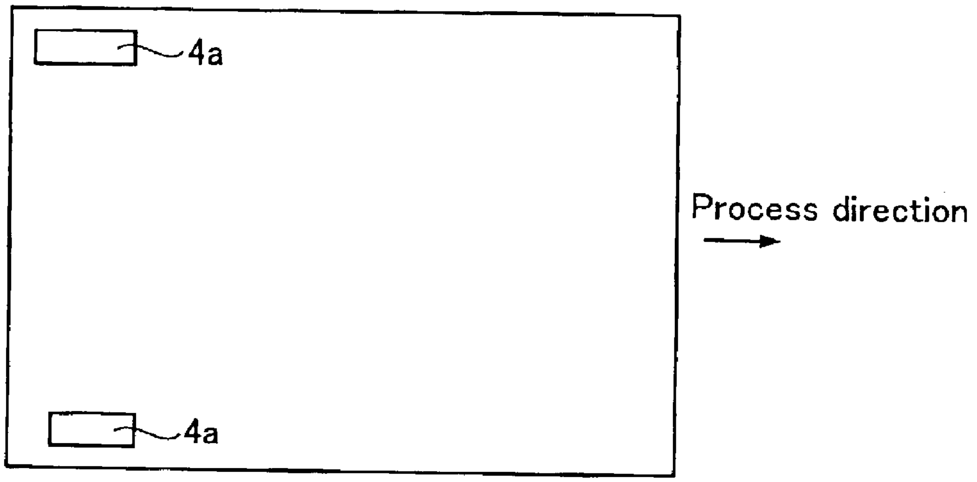
FIGS. 8A and 8B are schematic views showing another electronic paper used in the second embodiment.
Figure 8B:
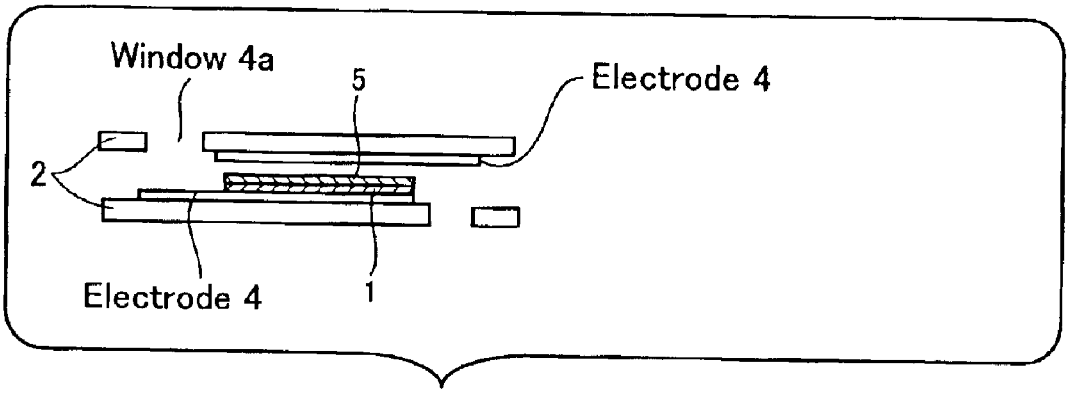
Figure 9A:
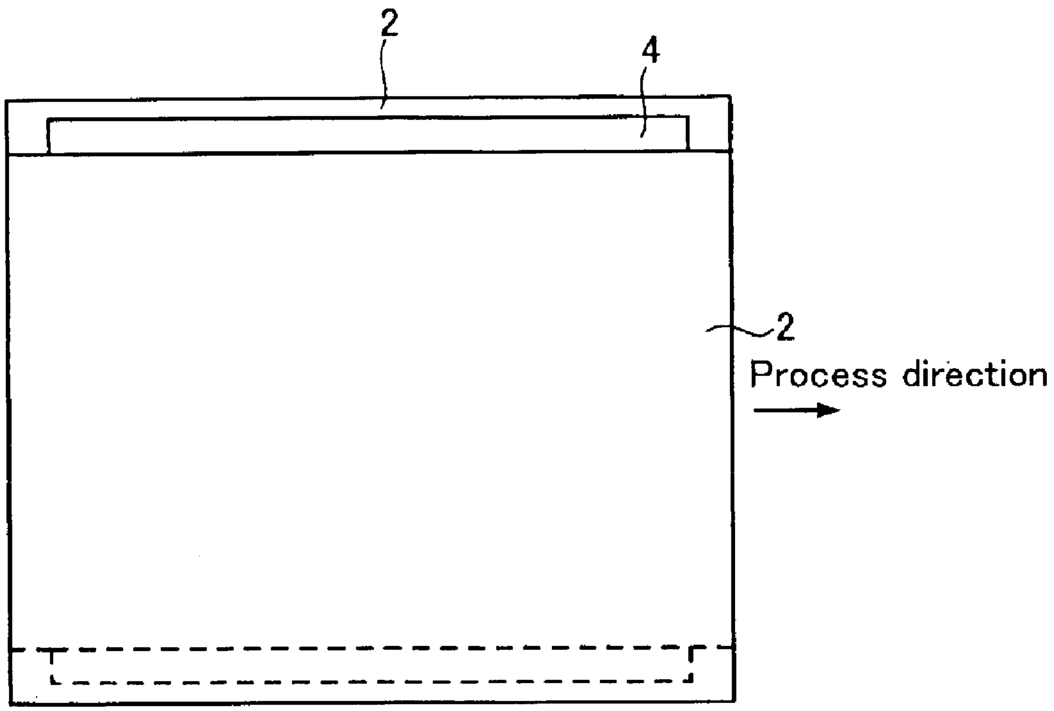
FIGS. 9A and 9B are schematic views showing further another electronic paper used in the second embodiment.
Figure 9B:
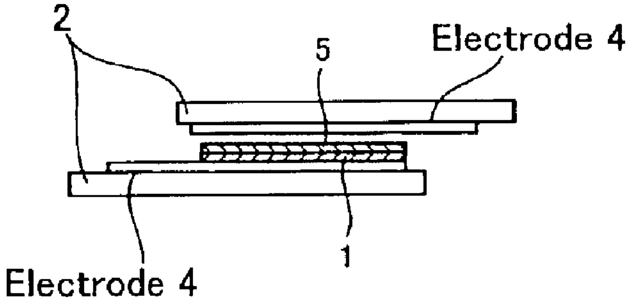

FIGS. 7A to 9B are schematic views showing an electronic paper used in the second embodiment. FIGS. 7A, 8A, and 9A are plan views. FIG. 7B is a sectional view along the process direction, observed from one side. FIGS. 8B and 9B are sectional views from the back side in the process direction.

In each of the electronic papers shown in FIGS. 7A to 8B, electrodes 4 are formed on inner surfaces of a pair of substrates 2. A display layer 1 where an image is written and an optical switching layer 5 whose resistance changes depending on the amount of irradiated light are stacked between the pair of electrodes 4. A voltage is applied between the pair of electrodes 4, and light expressing an image is irradiated onto the optical switching layer 5. Then, the image is written into the display layer 1.

PET, PES, or the like may be used for the substrates 2. A functional film such as a barrier film which prevents permeation of water or gas may be formed in addition to the electrodes 4.

Transparent electrodes may be made of ITO, $SnO_2$, or the like. Opaque electrodes if any may be made of metal such as Al, Au, or the like.

Any display element which has capability of memorization is applicable. For example, it is possible to use liquid crystal such as cholesteric liquid crystal or ferroelectric liquid crystal, or an element which is provided with capability of memorization by adding an additive to a display element having less or no capability of memorization by means of PDLC or encapsulation.

As the optical switching layer 5, an amorphous silicon element or an organic optical switching element is applicable. The organic optical switching element may be of a single-layer type having capability of charge transportation and a charge generation function or a two-layer type having separate functions of charge generation and charge transportation. Alternatively, the organic optical switching element may have a structure which can be driven by an alternating current and includes sequentially stacked layers, e.g., charge-generation-layer/charge-transportation-layer/charge-generation-layer.

The pair of substrates 2 and the electrodes 4 formed respectively on the substrates are all transparent. In the side of the optical switching layer, however, the substrate and the electrode may be transparent only with respect to the wavelength used for optical switching. This structure which consists of a display layer and an optical switching layer is a minimum structure. For example, a light shielding layer, isolation layer, or laminated layer may be stacked between the display layer and the optical switching layer.

In the electronic paper used in the present embodiment, the pair of substrates respectively have rectangular contact terminals (hereinafter called "windows") at their side end parts with respect to the process direction. Electric contacts to the electrodes formed on the opposed substrates can be made through the windows 4*a*. In the electronic paper shown in FIGS. 7A and 7B, two windows 4*a* whose positions are slightly shifted from each other are provided at one side end part in the rear side in the process direction. In another electronic paper shown in FIGS. 8A and 8B, windows are respectively provided at symmetric positions in both side end parts in the rear side along the process direction.

The windows 4*a* may be openings provided in the substrates 2. Alternatively, the windows 4*a* may each have a structure in which all or part of openings is covered with a conductive member in order to protect the electrodes 4. It is however preferred that the openings each be covered with a conductive member to guarantee mechanical strength and to reduce contact resistance to the electric contact sections.

The electric contact sections electrically contact the windows 4*a*, to apply a voltage between the pair of electrodes 4 of the electronic paper.

In the electronic paper shown in FIGS. 9A and 9B, electrodes 4 are formed in the inner surfaces of a pair of substrates. Two display layers 1 which encapsulate respectively two types of cholesteric liquid crystal having different threshold values, and an optical switching layer 5 whose resistance changes depending on the amount of irradiated light are stacked between the pair of electrodes 4. A voltage is applied between the pair of electrodes 4, and light expressing an image is irradiated onto the optical switching layer 5. Then, the image is written into the display layers 1.

Used as the optical switching layer 5 may be an amorphous silicon element or an organic optical switching element. The organic optical switching element may be of a single-layer type having charge transportation performance, electronic transportation performance and a charge generation function or a two-layer type having separate functions of charge generation and charge transportation. Alternatively, the organic optical switching element may have a structure which can be driven by an alternating current and consists of sequentially stacked layers, e.g., charge-generation-layer/charge-transportation-layer/charge-generation-layer.

In each electronic paper used in the present embodiment, the substrates 2 are shifted from each other so that one side end part of each one of the paired substrates 2 with respect to the process direction does not overlap the opposite substrate. A contact to each electrode 4 can be made at one side end part of the electronic paper.

Figure 10A:
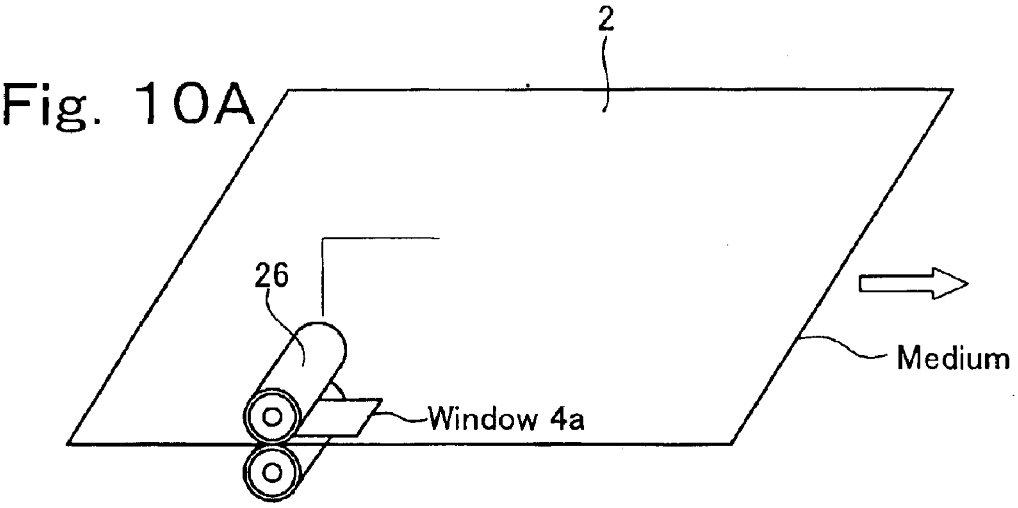
FIGS. 10A to 10C are schematic views each showing a state in which a voltage is applied between a pair of electrodes of an electronic paper from an electric contact section.
Figure 10B:
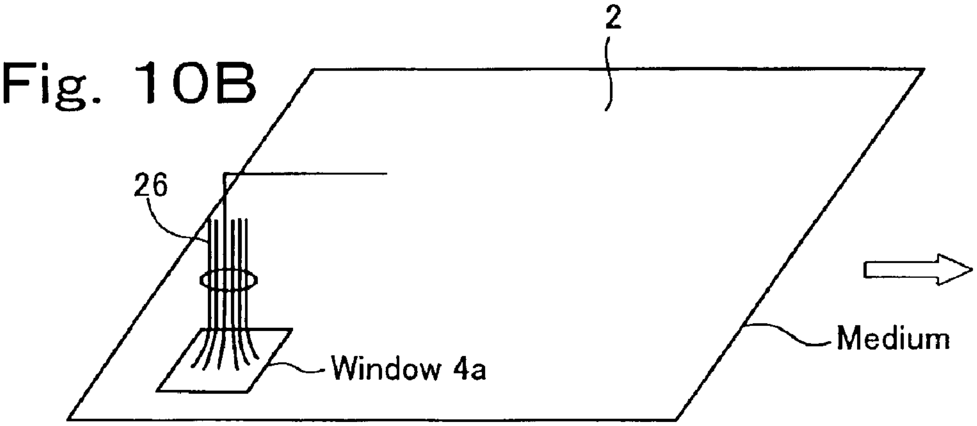
Figure 10C:
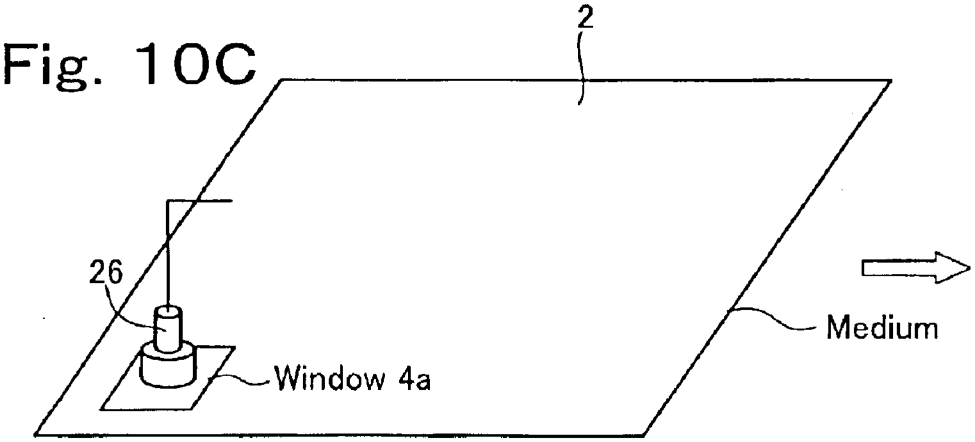

FIGS. 10A to 10C are schematic views each showing partially a state in which electric contact sections apply a voltage to paired electrodes of an electronic paper. FIG. 10A shows an example in which each electric contact section is constituted by rollers. FIG. 10B shows an example in which each electric contact section is constituted by a brush. FIG. 10C shows an example in which each electric contact section is a pad.

As shown in FIGS. 10A to 10C, each electric contact section 26 contacts an electrode 4 through a window 4*a*, so that the electronic paper can be applied with a voltage. In the electronic paper exemplified in FIGS. 7A and 7B, the windows 4*a* are provided in one side end part of the paper, slightly shifted from each other. In this case, electric contact sections 26 are also provided in the same side as the windows and slightly shifted from each other at an interval corresponding to that between the windows 4*a*. Alternatively, in the electronic paper exemplified in FIGS. 8A and 8B, the windows 4*a* are provided symmetrically at both side end parts, respectively. In this case, electronic contact sections 26 are provided symmetrically in both sides, respectively, corresponding to the positions of the windows 4*a*.

Usable as each electric contact section 26 may be a conductive roller, conductive brush, conductive pad, or the like. Alternatively, a flexible metal electrode may be used. Another roller or pad may be provided in the side opposed to the surface on which each electric contact section 26 contact a window 4*a*. If a roller is used, a gap may be created between the area of each window 4*a* and the other remaining area of the substrates 2. Therefore, in order to prevent skew, a mechanism which absorbs the gap may preferably be provided in the side in which the roller contacts an electrode or in the opposite side.

Writing control for applying a voltage between the electrodes of the electronic paper according to the present embodiment is carried out by applying a drive voltage for writing an image, between the electrodes 4 of the electronic paper, which electrically contact the electric contact sections 26.

The drive voltage may be generated by reading and amplifying a memorized waveform. Alternatively, the drive voltage may be obtained by generating a voltage waveform from a resonance circuit or the like and by adjusting the period and timing of the voltage waveform through a gate. Otherwise, a rectangular wave may be generated by switching a DC voltage using a switching regulator or the like. Normally used is a plus/minus rectangular wave having a frequency of 1 to 1 KHz and a peak-to-peak voltage of about 10 to 2,000 V. A bias may be applied depending on the type of electronic paper media to be used. In place of the rectangular pulse, a triangular or sine wave may be used. Either one-shot pulse or plural pulses may be applied. Plural pulses such as rectangular waves respectively having different voltages may be used in combination with each other.

The optically-written-image irradiation control section according to the present embodiment controls the optically-written-image irradiation section to adjust timing and brightness at which an optical image is displayed. The optically-written-image irradiation section may be any means that can output digital data as an optical image. For example, the optically-written-image irradiation section may be a transparent TFT-driven LCD, organic or inorganic EL display, CRT, VFD, plasma display, projector, or the like.

Although the present embodiment uses an optical image irradiation section of contact type, an optical image irradiation section of projection type may be used.

Figure 11:
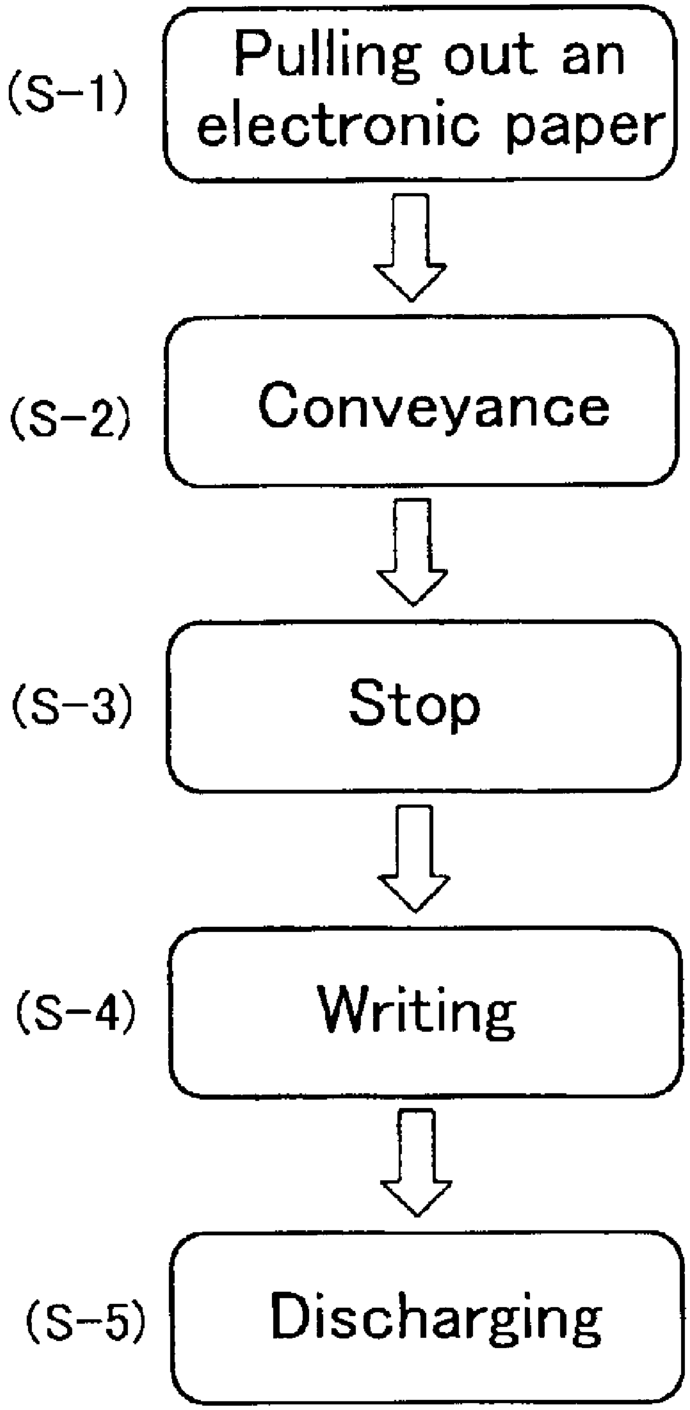
FIG. 11 is a flowchart of writing an image into an electronic paper by the image writing apparatus according to the second embodiment.

FIG. 11 shows a flowchart of writing an image onto an electronic paper by the image writing apparatus according to the present embodiment.

In FIG. 11, image information is inputted to the electronic paper through the net-connection control section, for example. The process control section then controls the mechanical process control section to start a control operation, and sends the inputted image information to the optically-written-image irradiation control section. The mechanical process control section controls the feed roller, conveyor rollers, and discharge rollers to rotate. One of the electronic papers contained in the container tray is pulled out (S-1).

The electronic paper pulled out is conveyed by the conveyor rollers. At this time, the mechanical process control section closes the gate of the position control section, so that the top end of the electronic paper is aligned with an axial direction which intersects the process direction. After the position of the electronic paper is thus aligned properly, the process control section starts an operation of controlling the optically-written-image irradiation control section and the writing control section. The position control section immediately opens the gate, so that the electronic paper is conveyed to the stage (S-2).

The electronic paper conveyed to the stage is stopped at a predetermined position by the record display medium stopper section (S-3).

The electronic paper stopped at the predetermined position is let contact closely the optically-written-image irradiation section by the curl prevention section, to restrain the electronic paper from curling. The writing control section applies a voltage between the pair of electrodes of the electronic paper through electric contact sections. The optically-written-image irradiation control section controls the optically-written-image irradiation section to irradiate the electronic paper with light for writing an image into the electronic paper. An image is thus written (S-4).

The writing control section applies a drive pulse at the same time when or after the electric contact sections contact the electrodes. The optically-written-image irradiation control section irradiates light onto the electronic paper from the optically-written-image irradiation section at the same time when or before the drive pulse is applied. The optically-written-image irradiation control section can stop the irradiation of light at the same time when the application of the drive pulse finishes or after a predetermined time of irradiation after the application of the drive pulse finishes.

For example, if a TFT-driven monochrome LCD having 800×600 pixels is used for the optically-written-image irradiation section, one image can be written in 100 ms for every electronic paper.

After the image is thus written, the curl prevention section releases the electronic paper from the state in which the electronic paper is kept in close contact with the optically-written-image irradiation section. The record display medium stopper section opens its gate, so that the electronic paper is discharged onto the discharge tray by the conveyor rollers and discharge rollers (S-5).

The same operation as described above is subsequently repeated for a required number of electronic papers. Plural electronic papers are then stacked on the discharge tray.

Thus, when each electronic paper of optical writing type is once stopped, an image is written into the electronic paper without blurring. Even if curling takes place while one electronic paper is repeatedly used, a clear image can be written because light expressing the image is irradiated after the electronic paper is kept in close contact with the optically-written-image irradiation section.

A third embodiment will now be described below.

Third Embodiment

The third embodiment corresponds to the third exemplary form of an image writing apparatus according to the present invention. Each electronic paper used in the third embodiment is the first form of the record display medium according to the present invention.

In the third embodiment, an electronic paper contained in a container tray with its optical switching layer facing upward is constantly kept in contact with a contact section provided at an upper part of the container tray. An image is formed on the optical switching layer of the electronic paper by an optical system provided above the container tray, to write the image into the electronic paper. The present embodiment includes the optical system and a pick-up roller for discharging the electronic paper on which an image has been written to a discharge tray. Differences from the second embodiment are in that the third embodiment does not have a feed roller or position control section and in that windows (contact terminals) of the electronic paper are formed only in one upper substrate. Other components of the structure of the third embodiment are the same as those of the second embodiment. Therefore, identical components will be denoted by identical reference symbols, and detailed descriptions thereof will be omitted.

Figure 12A:
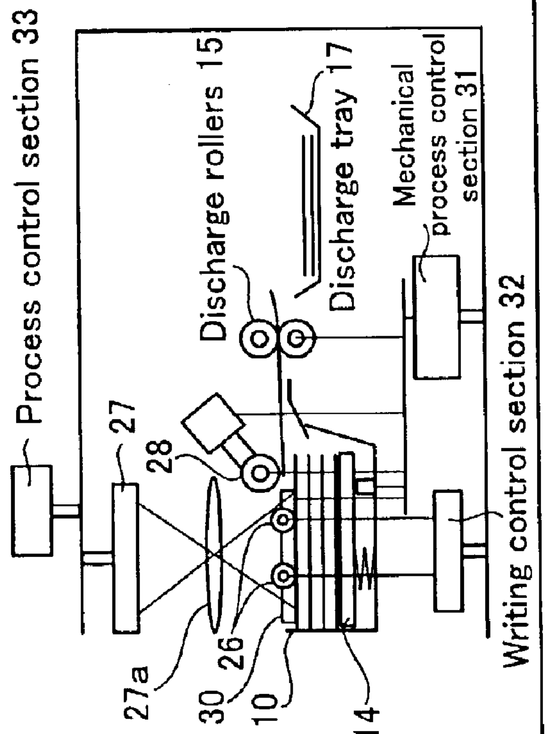
FIGS. 12A and 12B are schematic structural views showing an image writing apparatus according to the third embodiment of the present invention.
Figure 12B:
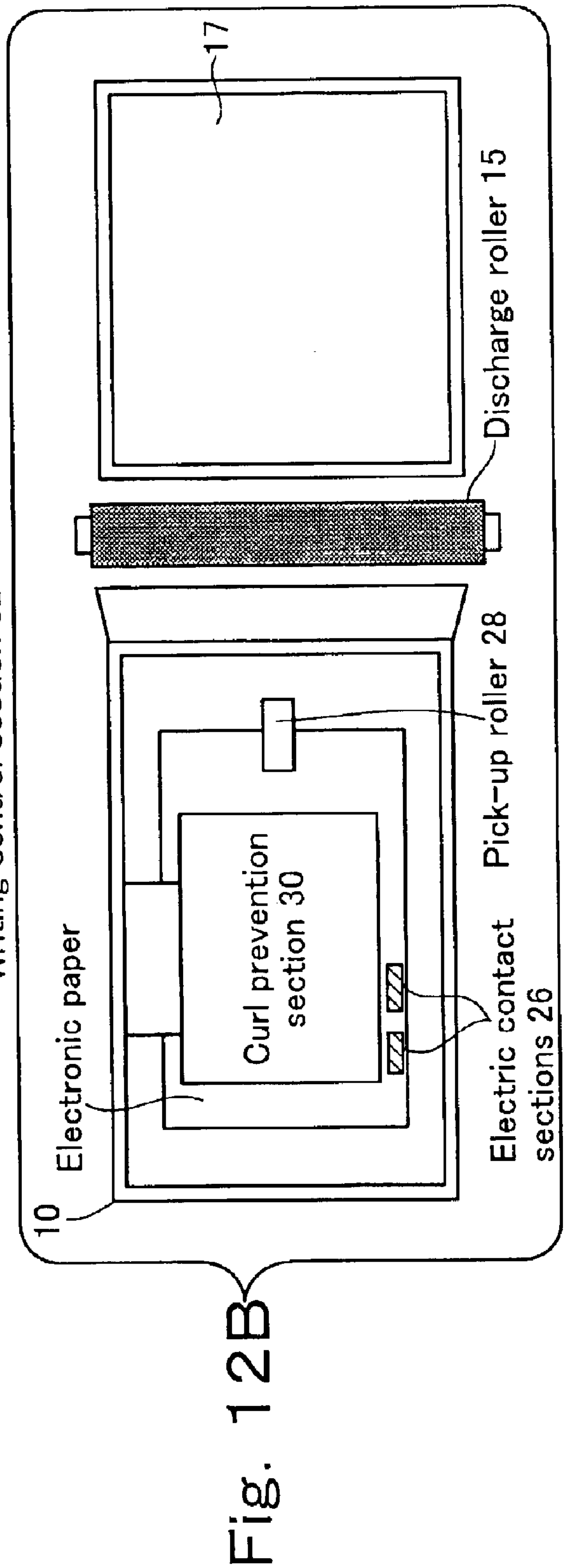

FIGS. 12A and 12B are schematic structural views showing an image writing apparatus according to the third embodiment. FIG. 12A is a front view and FIG. 12B is a plan view.

As shown in FIG. 12A, the image writing apparatus has a container tray 10, a conveyor section 14, a curl prevention section 30, electric contact sections 26, an optically-written-image irradiation section 27, an optical system 27*a*, pick-up roller 28, and a discharge tray 17. The conveyor section 14 pushes up the all electronic papers contained in the container tray 10. The curl prevention section 30 serves as a stopper section which stops and keeps an uppermost electronic paper stationary at a position where the uppermost electronic paper in the container tray 10 contacts the electric contacts sections 26. The curl prevention section 30 also serves to correct curling of the electronic paper kept stationary. The electric contact sections 26 contact a pair of electrodes through windows provided in the surface of an upper substrate of the electronic paper, to apply a voltage between the electrodes. The optically-written-image irradiation section 27 irradiates light expressing an image onto the electronic paper kept stationary. The optical system 27*a* forms an image on an optical switching layer of the electronic paper, from the light expressing the image. The pick-up roller 28 discharges the electronic paper on which an image has been written. The discharge tray 17 stores electronic papers on which images have been written.

In the present embodiment, an LCD of TFT type having resolution of 800×600 is used for the optically-written-image irradiation section. An image in four colors can be written in 200 ms for every electronic paper.

The image writing apparatus according to the present embodiment has a mechanical process control section 31, and a writing control section 32. The mechanical process control section 31 drives and controls the conveyor section 14, the curl prevention section 30 which also serves as a stopper section, and the pick-up roller 28. The writing control section 32 controls the timing and electric potential at which a voltage is applied between contact terminals of each electronic paper from the electric contact sections 26. The image writing apparatus also has a process control section 33, which adjusts control timings of the mechanical process control section 31 and the writing control section 32, controls the optically-written-image irradiation section 27 to display a predetermined optical image and adjusts brightness of the screen.

The mechanical process control section 31 controls the conveyor section 14 to press constantly the all electronic papers contained in the container tray 10 against the curl preventions section 30 which also serves as a stopper section. The uppermost electronic paper contained in the container tray 10 therefore contacts constantly the electric contact sections 26. The process control section 33 controls a series of processes from writing of an image into an electronic paper constantly contacting the electric contact sections 26 to discharging of the electronic paper to the discharge tray 17.

As shown in FIG. 12B, the uppermost electronic paper contained in the container tray 10 is pressed against the curl prevention section 30 which also serves as a stopper section. Each electronic paper has two contact terminals at a side end part of itself. The pick-up roller 28 contacts the top end part of the electronic paper in the process direction. Discharge rollers 15 and the discharge tray 17 are provided in the downstream side of the container tray 10 in the process direction.

The image writing apparatus according to the present embodiment thus focuses an output from a light bulb such as an LCD or EL on an optical switching element through an optical system such as a lens or the like, to form an image. The depth of field is so deep that an excellent image can be obtained even when the electronic paper is more or less deformed.

In the image writing apparatus according to the present embodiment, an image is formed on an optical switching layer of an electronic paper which is contained in the container tray with the optical switching layer facing upward, by using an optical system from the upside of the container tray. It is, however, possible to form an image on an optical switching layer of an electronic paper which is contained in the container tray with the optical switching layer facing downward, by using an optical system from the downside of the container tray. Alternatively, another optical system such as a lens array or the like which has directivity may be used in place of the optical system 27*a*, to irradiate light onto the optical switching layer from the upside of the container tray.

Figure 13A:
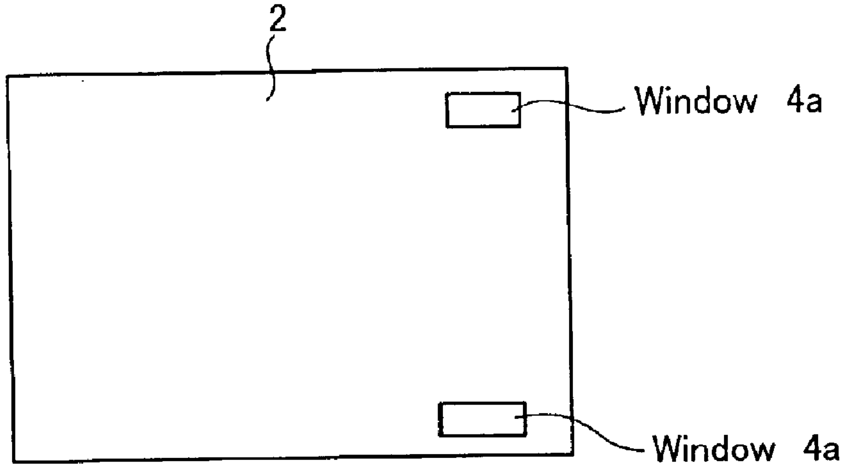
FIGS. 13A to 13C are plan views showing examples of electronic papers used in the third embodiment.
Figure 13B:
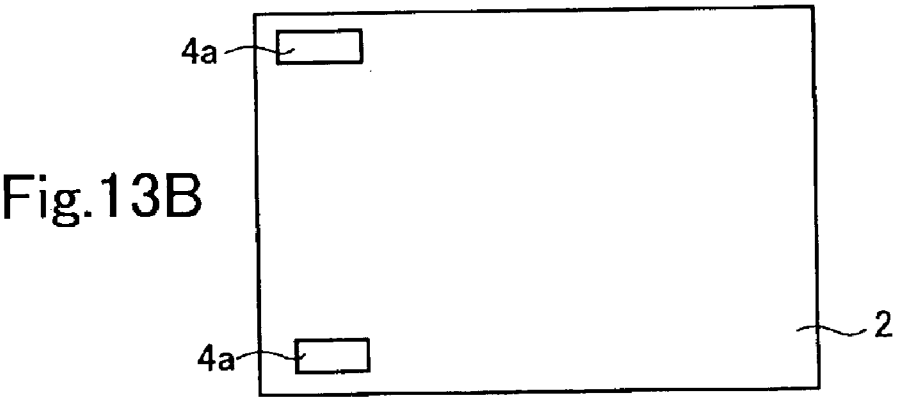
Figure 13C:
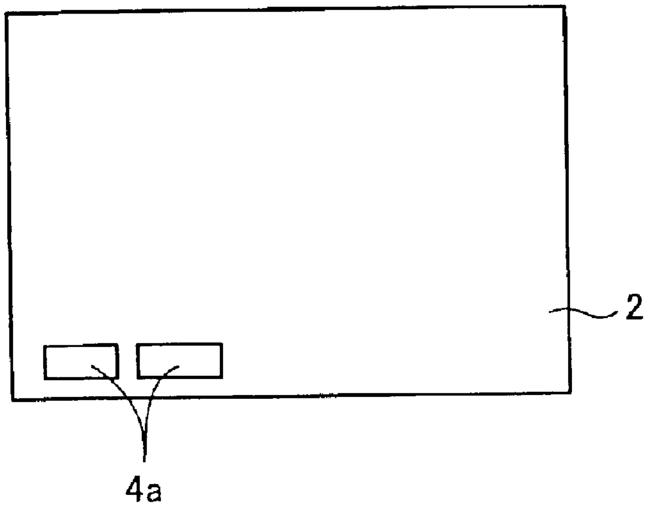

FIGS. 13A to 13C are plan views showing examples of electronic papers used in the present embodiment.

The electronic paper shown in FIG. 13A has contact terminals respectively in both sides at the top end in the process direction. The electronic paper shown in FIG. 13B has contact terminals respectively in both sides at the rear end in the process direction. The electronic paper shown in FIG. 13C has contact terminals at one side end in the rear part in the process direction.

Since contact terminals are thus formed on each electronic paper, the thickness is greater in the areas of these terminals than peripheral areas around them. Postures of the electronic papers hence vary greatly when they are conveyed. Therefore, the contact terminals 4*a* should preferably be provided in the rear end in the process direction and more preferably be provided symmetrically in both sides respectively.

When a large number of electronic papers are stacked in the container tray, the electronic papers may stick to each other preventing the pick-up roller from discharging the papers. It is therefore preferred to coat a surface of each electronic paper with a polyester layer.

What is claimed is:

1. An image writing apparatus comprising:

a conveyor section which conveys a record display medium including a display layer on which an image is displayed in a non-volatile manner, the display layer sandwiched between opposed electrodes;

a contact section which electrically contacts the electrodes of the record display medium; and a writing section which writes an image into the display layer of the record display medium, the electrodes of which are contacted by the contact section.

2. The apparatus according to claim 1, further comprising a position control section which adjusts position of the record display medium being conveyed by the conveyor section, before the contact section contacts the electrodes.

3. The apparatus according to claim 1, further comprising a discharge section which discharges the record display medium in which the image has been written into the display layer, to a predetermined discharge position.

4. The apparatus according to claim 1, wherein the electrodes are matrix electrodes including scanning electrodes and data electrodes opposed to each other with the display layer interposed therebetween, and the writing section applies a voltage based on a signal expressing an image to the contact section, to write the image on pixels formed of arbitrary intersections between the scanning electrodes and the data electrodes.

5. The apparatus according to claim 1, further comprising:

a record display medium stopper section which stops the record display medium conveyed by the conveyor section, to be kept stationary at a position where the electrodes of the record display medium contacts the contact section; and a voltage application section which applies a predetermined voltage to the contact section contacting the electrodes, wherein the record display medium is made by sandwiching, in addition to the display layer, an optical switching layer between the electrodes, the optical switching layer having resistance which changes depending on irradiation of light, and the writing section irradiates light expressing an image onto the optical switching layer of the record display medium whose electrodes are contacted by the contact section, to write an image into the display layer.

6. The apparatus according to claim 5, further comprising a correction section which corrects curling of the record display medium stopped at the position where the electrodes of the record display medium contacts the contact section by the record display medium, before the light is irradiated onto the optical switching layer from the writing section.

7. The apparatus according to claim 5, further comprising a tray which contains a plurality of record display media having the optical switching layer facing upward, wherein the voltage application section applies the voltage to the contact section which contacts the electrodes of uppermost one of the record display media contained in the tray, and the writing section has an image forming optical system to focus light, forming an image, and irradiates the optical switching layer of the uppermost one record display medium contacting the contact section, with light expressing the image and focused by the optical system.

8. The apparatus according to claim 5, further comprising a tray which contains a plurality of record display media having the optical switching layer facing downward, wherein the voltage application section applies the voltage to the contact section which contacts the electrodes of lowermost one of the record display media contained in the tray, and the writing section has an image forming optical system to focus light, forming an image, and irradiates the optical switching layer of the lowermost one record display medium contacting the contact section, with light expressing the image and focused by the optical system.

9. The apparatus according to claim 5, further comprising a tray which contains plural record display media each having the optical switching layer facing upward, wherein the voltage application section applies the voltage to the contact section which contacts the electrodes of uppermost one of the record display media contained in the tray, and the writing section has an optical system, which irradiates light having directivity and irradiates the light having the directivity and expressing an image, onto the optical switching layer of the uppermost one record display medium contacting the contact section, from the optical system.

10. The apparatus according to claim 5, wherein the record display medium is made by forming the electrodes respectively on inner surfaces of the pair of opposed substrates, and has at least two contact terminals on an outer surface of one of the pair of substrates, the contact terminals electrically conducted to the electrodes.

11. The apparatus according to claim 5, wherein the record display medium is made by forming the electrodes respectively on inner surfaces of the pair of opposed substrates, and has at least two contact terminals respectively on outer surfaces of the pair of substrates, the contact terminals electrically conducted to the electrodes formed on the inner surfaces of the opposed substrate.

12. The apparatus according to claim 10, wherein the record display medium has the contact terminals at a side end in a rear side in a conveyance direction in which the record display medium is conveyed by the conveyor section, on one or respectively on both of the outer surfaces.

13. The apparatus according to claim 11, wherein the record display medium has the contact terminals at a side end in a rear side in a conveyance direction in which the record display medium is conveyed by the conveyor section, on one or respectively on both of the outer surfaces.

14. The apparatus according to claim 10, wherein the record display medium has the contact terminals respectively at laterally symmetrical positions in a rear side in a conveyance direction in which the record display medium is conveyed by the conveyor section, on one or respectively on both of the outer surfaces.

15. The apparatus according to claim 11, wherein the record display medium has the contact terminals respectively at laterally symmetrical positions in a rear side in a conveyance direction in which the record display medium is conveyed by the conveyor section, on one or respectively on both of the outer surfaces.

16. A record display medium comprising:

electrodes respectively formed on a pair of opposed substrates;

a display layer which displays an image; and an optical switching layer having resistance which changes depending on irradiation of light, wherein the display layer and the optical switching layer are stacked between the electrodes, and at least two contact terminals electrically conducted to the electrodes are provided on an outer surface of one of the pair of substrates.

17. A record display medium comprising:

electrodes respectively formed on a pair of opposed substrates;

a display layer which displays an image; and an optical switching layer having resistance which changes depending on irradiation of light, wherein the display layer and the optical switching layer are stacked between the electrodes, and at least two contact terminals electrically conducted to the electrodes formed in the inner surfaces of the opposed substrates are provided respectively on outer surfaces of the pair of substrates.

18. The medium according to claim 16, wherein the contact terminals are provided at positions close to an end, on one edge of the outer surface of the one of the pair of substrates or the outer surfaces of the pair of substrates respectively.

19. The medium according to claim 17, wherein the contact terminals are provided at positions close to an end, on one edge of the outer surface of the one of the pair of substrates or the outer surfaces of the pair of substrates respectively.

20. The medium according to claim 16, wherein the contact terminals are provided at symmetrical positions close to an end, on two opposed edges of the outer surface of the one of the pair of substrates or the outer surfaces of the pair of substrates respectively.

21. The medium according to claim 17, wherein the contact terminals are provided at symmetrical positions close to an end, on two opposed edges of the outer surface of the one of the pair of substrates or the outer surfaces of the pair of substrates respectively.

* * * * *